US010387048B2

(12) United States Patent
Lee et al.

(10) Patent No.: US 10,387,048 B2
(45) Date of Patent: Aug. 20, 2019

(54) MEMORY DEVICES CONFIGURED TO LATCH DATA FOR OUTPUT IN RESPONSE TO AN EDGE OF A CLOCK SIGNAL GENERATED IN RESPONSE TO AN EDGE OF ANOTHER CLOCK SIGNAL

(71) Applicant: MICRON TECHNOLOGY, INC., Boise, ID (US)

(72) Inventors: Eric Lee, San Jose, CA (US); Qiang Tang, Cupertino, CA (US); Ali Feiz Zarrin Ghalam, Sunnyvale, CA (US); Hoon Choi, Santa Clara, CA (US); Daesik Song, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/006,192

(22) Filed: Jun. 12, 2018

(65) Prior Publication Data

US 2018/0292990 A1 Oct. 11, 2018

Related U.S. Application Data

(62) Division of application No. 15/084,979, filed on Mar. 30, 2016, now Pat. No. 10,019,170.

(51) Int. Cl.
| G11C 16/32 | (2006.01) |
| G06F 3/06 | (2006.01) |
| G11C 16/26 | (2006.01) |
| G06F 12/0802 | (2016.01) |
| G11C 7/10 | (2006.01) |
| G11C 7/22 | (2006.01) |
| G06F 12/02 | (2006.01) |

(52) U.S. Cl.
CPC ............ *G06F 3/061* (2013.01); *G06F 3/0656* (2013.01); *G06F 3/0679* (2013.01); *G06F 12/0215* (2013.01); *G06F 12/0802* (2013.01); *G11C 7/106* (2013.01); *G11C 7/1066* (2013.01); *G11C 7/222* (2013.01); *G11C 16/26* (2013.01); *G11C 16/32* (2013.01); *G06F 2212/1016* (2013.01); *G06F 2212/2022* (2013.01); *G06F 2212/222* (2013.01); *G06F 2212/7203* (2013.01)

(58) Field of Classification Search
CPC .................. G11C 7/106; G11C 7/1066; G05B 2219/25181; G06F 13/1647
See application file for complete search history.

(56) References Cited

U.S. PATENT DOCUMENTS

| 5,841,732 A | 11/1998 | Mick |
| 5,883,855 A | 3/1999 | Fujita |

(Continued)

*Primary Examiner* — Mushfique Siddique
(74) *Attorney, Agent, or Firm* — Dicke, Billig & Czaja, PLLC

(57) ABSTRACT

Memory device including a controller configured to cause the memory device to generate a first clock edge of a first clock signal in response to a first clock edge of a second clock signal, to generate a second, opposite, clock edge of the first clock signal immediately following the first clock edge of the first clock signal in response to a second, opposite, clock edge of the second clock signal immediately following the first clock edge of the second clock signal, and to latch data for output from the memory device in response to the second clock edge of the first clock signal.

8 Claims, 4 Drawing Sheets

(56) References Cited

U.S. PATENT DOCUMENTS

| | | | | |
|---|---|---|---|---|
| 6,101,136 | A * | 8/2000 | Mochida | G11C 7/1018 365/194 |
| 7,030,676 | B2 * | 4/2006 | Hazucha | H02M 3/157 327/172 |
| 7,178,001 | B2 | 2/2007 | Mes | |
| 7,394,721 | B1 | 7/2008 | Vemula | |
| 7,408,822 | B2 | 8/2008 | Silvestri | |
| 7,426,144 | B2 * | 9/2008 | Fujisawa | G11C 7/1012 365/189.02 |
| 7,565,466 | B2 | 7/2009 | Dietrich | |
| 7,605,631 | B2 | 10/2009 | LaBerge | |
| 7,975,164 | B2 | 7/2011 | Lee et al. | |
| 8,015,460 | B2 | 9/2011 | Grunzke | |
| 8,711,639 | B2 * | 4/2014 | Eric | G06F 1/08 365/189.05 |
| 8,937,839 | B2 * | 1/2015 | Lee | G06F 1/08 365/189.05 |
| 9,183,900 | B2 * | 11/2015 | Lee | G06F 1/08 |
| 9,384,847 | B2 | 7/2016 | Gillingham et al. | |
| 9,460,803 | B1 | 10/2016 | Tang et al. | |
| 9,478,270 | B2 * | 10/2016 | Lee | G06F 1/08 |
| 2006/0007759 | A1 | 1/2006 | Silvestri | |
| 2006/0066375 | A1 | 3/2006 | LaBerge | |
| 2007/0260781 | A1 | 11/2007 | Dietrich | |
| 2008/0175327 | A1 * | 7/2008 | Truong | H04L 25/45 375/257 |
| 2011/0298512 | A1 | 12/2011 | Kwak | |
| 2012/0110368 | A1 * | 5/2012 | Lee | G06F 1/08 713/601 |
| 2014/0233324 | A1 * | 8/2014 | Lee | G06F 1/08 365/189.02 |
| 2014/0250260 | A1 * | 9/2014 | Yap | G06F 12/0246 711/103 |
| 2015/0082072 | A1 * | 3/2015 | Pyeon | G11C 5/025 713/400 |
| 2015/0109866 | A1 * | 4/2015 | Lee | G06F 1/08 365/189.02 |
| 2016/0042777 | A1 * | 2/2016 | Lee | G06F 1/08 365/189.02 |

* cited by examiner

MEMORY DEVICES CONFIGURED TO LATCH DATA FOR OUTPUT IN RESPONSE TO AN EDGE OF A CLOCK SIGNAL GENERATED IN RESPONSE TO AN EDGE OF ANOTHER CLOCK SIGNAL

RELATED APPLICATION

This Application is a Divisional of U.S. application Ser. No. 15/084,979, titled "LATCHING DATA FOR OUTPUT AT AN EDGE OF A CLOCK SIGNAL GENERATED IN RESPONSE TO AN EDGE OF ANOTHER CLOCK SIGNAL," filed Mar. 30, 2016, now U.S. Pat. No. 10,019,170 issued on Jul. 10, 2018 which is commonly assigned and incorporated herein by reference.

FIELD

The present disclosure relates generally to memory devices, and, in particular, the present disclosure relates to latching data for output, e.g., from a memory device, at an edge of a clock signal generated in response to an edge of another clock signal.

BACKGROUND

Memory devices, such as flash memory devices (e.g., NAND, NOR, etc.), have developed into a popular source of non-volatile memory for a wide range of electronic applications. Non-volatile memory is memory that can retain its data values for some extended period without the application of power. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

In some examples, memory devices might latch data for output, such as during a read operation, e.g., to a host. For example, the read data might be latched to input/output (I/O) circuitry of the memory device for output. In some examples, the read data might be latched to a read buffer, such as a read FIFO buffer, of the input/output (I/O) circuitry, e.g., that might be adjacent to output pins of the memory device.

Memory devices might include a data cache, for example, that may be connected between the read FIFO and an array of memory cells of the memory device. The data cache, for example, may temporarily store the data read from the array while the array is busy. The data may be passed from the data cache to the read FIFO and latched to the read FIFO for output.

For example, the data may be passed from the data cache to the read FIFO in response to a first clock signal and latched in the read FIFO in response to a second clock signal. However, differences in the structure of the paths for the data and the second clock signal, as well as process variations, may lead to timing difficulties in latching the data to the read FIFO while the data is valid.

DETAILED DESCRIPTION

Figure 1:
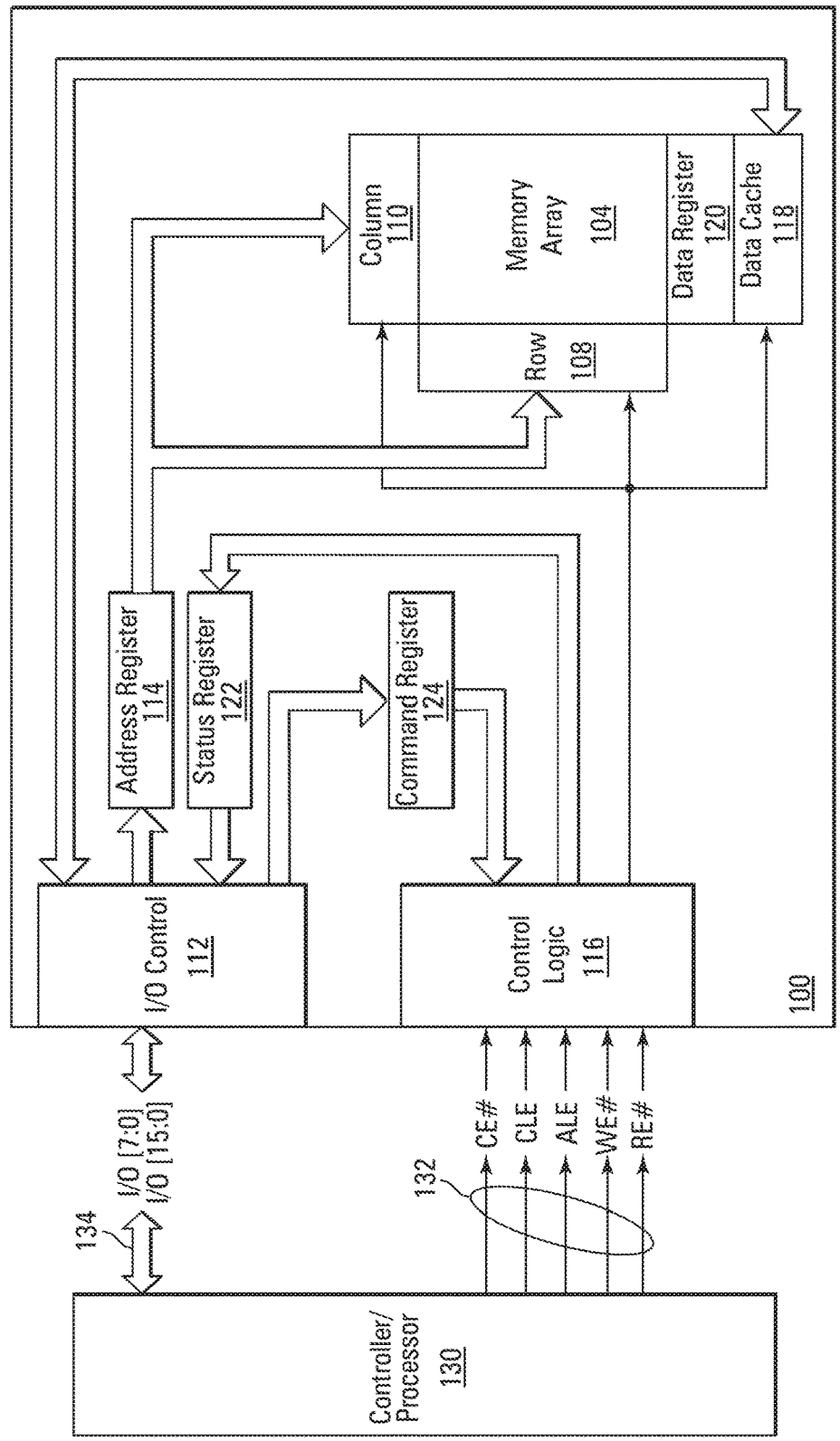
FIG. 1 is a simplified block diagram of an example of a memory system configured to perform the methods disclosed herein.

In the following detailed description, reference is made to the accompanying drawings that form a part hereof, and in which is shown, by way of illustration, specific examples. In the drawings, like numerals describe substantially similar components throughout the several views. Other examples may be utilized and structural, logical, and electrical changes may be made without departing from the scope of the present disclosure. The following detailed description is, therefore, not to be taken in a limiting sense.

FIG. 1 is a simplified block diagram of an electronic device, e.g., an integrated circuit device, such as a memory device 100, in communication with a controller 130, such as a memory controller, e.g. a host controller, as part of an electronic system (e.g., a memory system), according to an example. Memory device 100 might be a NAND flash memory device, for example.

Controller 130 might include a processor, for example. Controller 130 might be coupled to a host, for example, and may receive command signals (or commands), address signals (or addresses), and data signals (or data) from the host and may output data to the host.

Memory device 100 includes an array of memory cells 104. A row decoder 108 and a column decoder 110 might be provided to decode address signals. Address signals may be received and decoded to access memory array 104.

Memory device 100 may also include input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for controller 130. The control logic 116 is in communication with row decoder 108 and column decoder 110 to control the row decoder 108 and column decoder 110 in response to the addresses.

Control logic 116 can be included in controller 130. Controller 130 can include, other circuitry, firmware, software, or the like, whether alone or in combination. Controller 130 can be an external controller (e.g., in a separate die from the memory array 104, whether wholly or in part) or an internal controller (e.g., included in a same die as the memory array 104). For example, an internal controller might be a state machine or a memory sequencer.

Control logic 116, e.g., and thus controller 130 when control logic 116 might be included in controller 130, may be configured to cause memory device 100 or a system, such as the system in FIG. 1 that includes memory device 100, to perform the methods disclosed herein, such as the methods of latching data for output from memory device 100. For example, control logic 116, e.g., and thus controller 130 when control logic 116 might be included in controller 130, may be configured to cause memory device 100 to generate a rising clock edge of a first clock signal in response to a rising clock edge of a second clock signal, to cause memory device 100 to generate a falling clock edge of the first clock signal immediately following the rising clock edge of the first clock signal in response to a falling clock edge of the second clock signal immediately following the rising clock edge of the second clock signal, and to cause memory device 100 to latch data for output from memory device 100 in response to the falling clock edge of the first clock signal.

Figure 2:
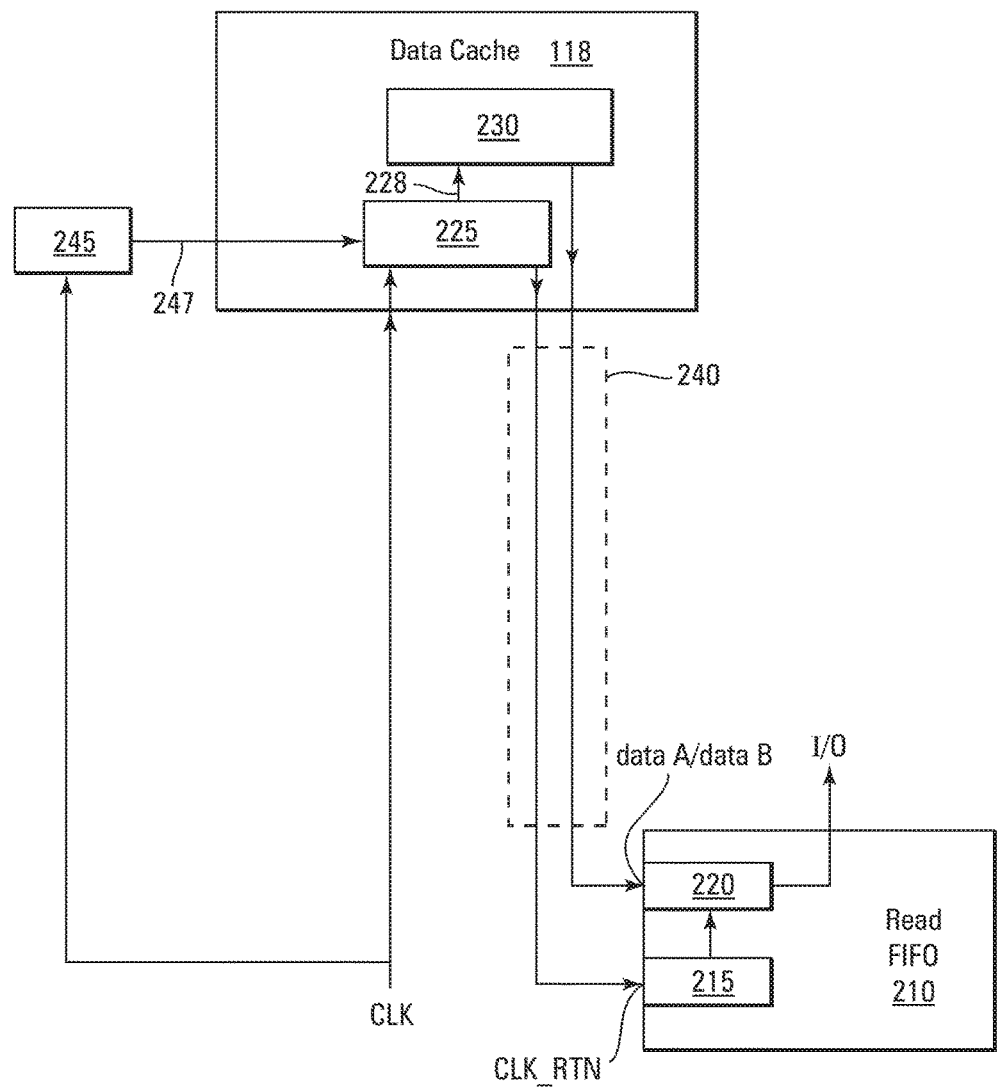
FIG. 2 illustrates a block diagram of an example of a portion of a memory device configured to perform the methods disclosed herein.

In some examples, control logic 116, e.g., and thus controller 130 when control logic 116 might be included in controller 130, may be configured to cause memory device 100 to perform a method of latching data for output from memory device 100, where the method might include for example, generating a clock pulse of a first clock signal, the clock pulse of the first clock signal having a rising edge and a falling edge; generating a clock pulse of a second clock signal, the clock pulse of the second clock signal having a rising edge generated in response to the rising edge of the clock pulse of the first clock signal and a falling edge generated in response to the falling edge of the clock pulse of the first clock signal; outputting the data from a data cache, such as data cache 118 in FIG. 1, of the memory device 100 in response to the rising edge of the clock pulse of the first clock signal; and latching the data to a read buffer, such as the read FIFO 210 in FIG. 2, of the memory device 100 for output from the memory device 100 in response to the falling clock edge of the clock pulse of the second clock signal.

In other examples, control logic 116, e.g., and thus controller 130 when control logic 116 might be included in controller 130, may be configured to cause memory device 100 to perform a method of latching data for output from memory device 100, where the method might include for example, generating a first clock signal having a synchronous portion generated in response to a first portion of a second clock signal having a first frequency and an asynchronous portion generated in response to a second portion of the second clock signal having a second frequency less than the first frequency; latching first data for output from the memory device in response to a falling clock edge in the synchronous portion of the first clock signal and generated in response to a falling clock edge in the first portion of the second clock signal; and latching second data for output from the memory device in response to a falling clock edge in the asynchronous portion of the first clock signal and generated independently of the second clock signal.

Control logic 116 is also in communication with the data cache 118. Data cache 118 latches data, either incoming or outgoing, as directed by control logic 116 to temporarily store data while the memory array 104 is busy writing or reading, respectively, other data. In some examples, during a write operation, data may be passed from the data cache 118 to data register 120 for transfer to the memory array 104; then new data may be latched in the data cache 118 from the I/O control circuitry 112. In some examples, during a read operation, data may be passed from the data cache 118 to the I/O control circuitry 112 for output to controller 130 and subsequent output to a host; then new data may be passed from the data register 120 to the data cache 118. A status register 122 may be in communication with I/O control circuitry 112 and control logic 116 to latch the status information for output to the controller 130, in some examples.

In some examples, memory device 100 may receive control signals at control logic 116, e.g., from controller 130 over a control link 132. The control signals may include at least a chip enable CE#, a command latch enable CLE, an address latch enable ALE, a write enable WE#, and a read enable RE#. In some examples, memory device 100 may receive command signals (which represent commands), address signals (which represent addresses), and data signals (which represent data), e.g., from controller 130 over a multiplexed input/output (I/O) bus 134 and outputs data to controller 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into data cache 118. The data are subsequently written into data register 120 for programing memory array 104. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

FIG. 2 illustrates a block diagram of an example of data cache 118 connected to a read buffer, such as the read FIFO 210. For example, read FIFO 210 may be located near the I/O pins in FIG. 1. Read FIFO 210 might include a controller 215, such as a read buffer controller (e.g., a read FIFO controller), and latches 220, such as read buffer latches (e.g., read FIFO latches). In some examples, read FIFO 210 might be part of the I/O control circuitry 112 in FIG. 1.

During an operation that may cause data to be latched to read FIFO 210 for output from memory device 100, for example, control logic 116 might output a clock signal CLK in response to control logic 116 receiving read enable RE#. Clock signal CLK may then be sent to a clock generator 225, such as a data path clock generator. Clock generator 225 may generate a clock signal CLK_RTN that may be sent to controller 215 of read FIFO 210. Clock generator 225 may output a signal 228 that causes data A, e.g., that might be stored (e.g., temporarily) in latches 230 of data cache 118, to be output from data cache 118 and sent from data cache 118 to latches 220 of read FIFO 210.

Clock generator 225 may be adjacent to latches 230, and the data A and the clock signal CLK_RTN might propagate (e.g., concurrently) along a data path 240, for example, from data cache 118 to read FIFO 210. In some examples, data path 240 might include logic, buffers, etc. For example, data cache 118 (e.g., latches 230), data path 240, and read FIFO 210, e.g., latches 220, might be referred to as a pipeline, such as a wave-pipeline. Although clock generator 225 may be shown in data cache 118, clock generator 225 might be part of I/O control circuitry 112, in some examples.

A delay circuit 245, such as a one-shot circuit, may be connected to clock generator 225. Delay circuit 245 may receive the clock signal CLK and may output a signal 247 to clock generator 225 in response to the clock signal CLK after a delay. For example, delay circuit may generate signal 247 after the delay.

Figure 3:
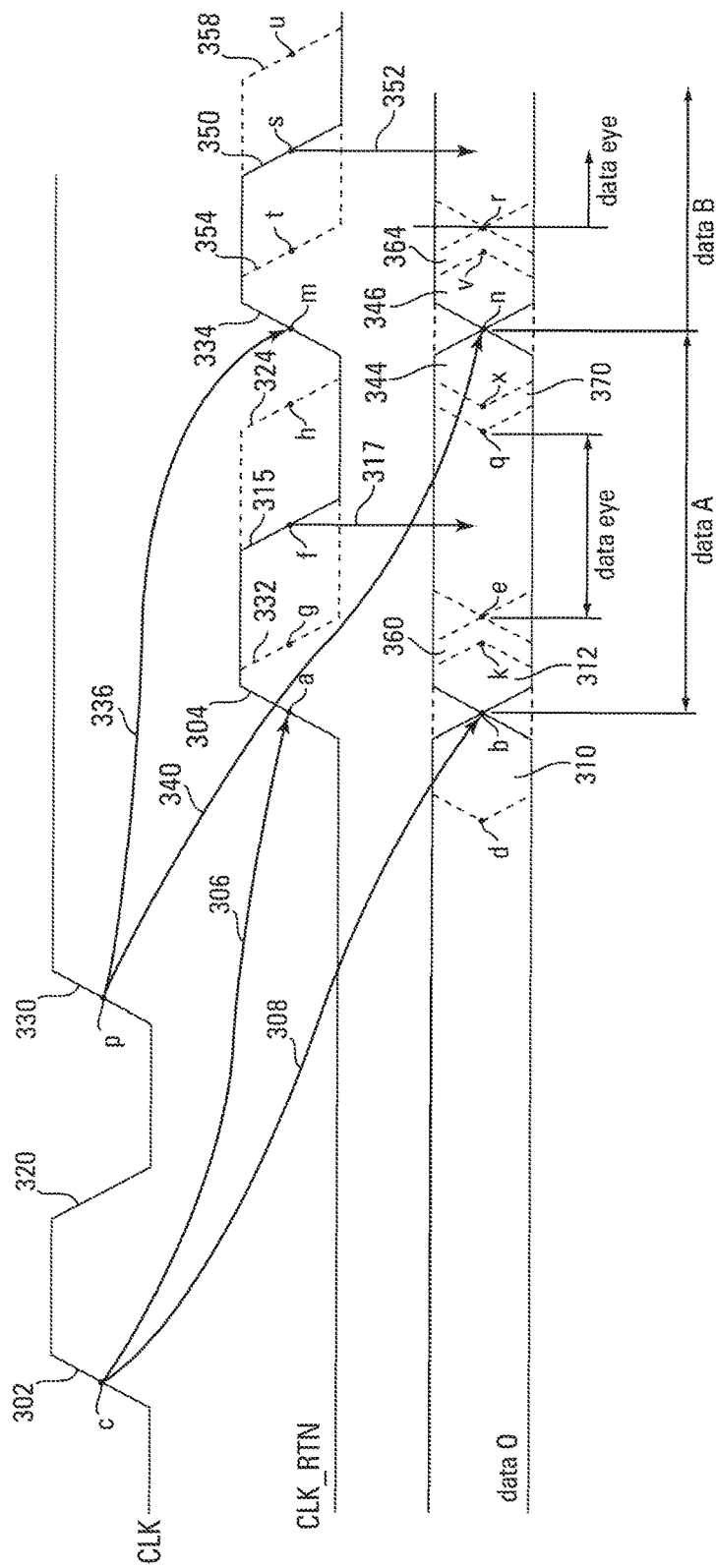
FIG. 3 presents examples of timing diagrams for latching data for output from a memory device, according to an example of the background art.

FIG. 3 presents examples of timing diagrams for an operation of latching data for output from a memory device, such as memory device 100 in FIG. 1, e.g., as a portion of a read operation, according to an example of the background art. For example, FIG. 3 presents timing diagrams for the clock signal CLK, the clock signal CLK_RTN, data A, and data B. Data A, data B, and the clock signal CLK_RTN in FIG. 3 occur at the read FIFO 210 and are relative to clock signal CLK. As such, there is a time delay between the clock signal CLK and data A and clock signal CLK_RTN and a time delay between the clock signal CLK and data B and clock signal CLK_RTN.

When the clock signal CLK transitions from low to high, a rising clock edge 302 is produced. The rising clock edge 302 may cause clock generator 225 to generate a rising clock edge 304 in the clock signal CLK_RTN, as indicated by arrow 306. That is, for example, the clock signal CLK_RTN may transition from low to high to produce rising clock edge 304 in response to the clock signal CLK transitioning from low to high. For example, rising clock edge 304 may be generated in response to rising clock edge 302. Note that while specific transitions of signals, e.g., low to high (e.g., a rising edge) or high to low (e.g., a falling edge), may be provided in various examples, the transitions could be reversed with appropriate changes to logic. For example, where a particular transition of a clock signal, e.g., low to high, might cause a particular response, that particular response might instead be caused by the opposite transition of that clock signal, e.g., high to low. In addition, where a particular transition of a clock signal might cause a particular response, e.g., a transition of another clock signal from low to high, that particular response might instead be a transition of the other clock signal from high to low. Rising and falling edges, for example, might be referred to herein as opposite clock edges, e.g., where a falling edge might be referred to as an opposite edge of a rising edge and vice versa.

The rising clock edge 302 may also cause clock generator 225 to output the signal 228 (FIG. 2) that causes data cache 118 (e.g., latches 230) to output the data A, as indicated by arrow 308. That is, for example, data A may be output from data cache 118 in response to clock signal CLK transitioning from low to high to produce rising clock edge 304. For example, output (e.g., transfer) of data A from data cache 118 may be initiated in response to rising clock edge 302. Rising clock edge 304 may be generated before or after the output of data A, depending upon delays along their respective paths, for example. In some examples, generating the rising clock edge 304 in the clock signal CLK_RTN in response to rising clock edge 302 may include outputting the rising clock edge 304 from clock generator 225, and data from data cache 118, in response to rising clock edge 302. In some examples, rising clock edge 304 and data A might be output concurrently from data cache 118.

As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

Point a (e.g., at the center of rising clock edge 304) denotes the arrival of rising clock edge 304 at read FIFO 210, and point b denotes the arrival of data A at read FIFO 210. Ideally, rising clock edge 304 and data A might arrive at read FIFO 210 concurrently (e.g., at the same time). Data A might arrive at read FIFO 210 after data O arrives at read FIFO 210, for example.

The time difference (e.g., that might be called the round-trip time) between when the rising clock edge 302 occurs (e.g., when the rising clock edge 302 is generated) and the time when rising clock edge 304 and data A might arrive read FIFO 210 represents system delays, such as logic delays, buffer delays, RC delays, etc. That is, for example, the roundtrip time might be the time difference between the time at the center of rising clock edge 302, denoted by point c, and the time at points a and b. Note that the roundtrip time may be greater than the period of the clock signal CLK.

Although steps may be taken to facilitate data A and rising clock edge 304 arriving at read FIFO 210 at the same time (e.g., points a and b might occur at the same time), there might be a variation between the time when rising clock edge 304 arrives at read FIFO 210 and the time when data A arrives at read FIFO 210, e.g., due to structural, process, voltage, and/or temperature variations. For example, data A might arrive early relative to (e.g., might arrive before) rising clock edge 304. That is, for example, point d denotes data A arriving before rising clock edge 304, e.g., point d occurs before point a. For example, region 310 denotes data A arriving early relative to the rising clock edge 304.

Data A might arrive late relative to (e.g., might arrive after) rising clock edge 304. That is, for example, point e denotes data A arriving after rising clock edge 304, e.g., point e occurs after point a. For example region 312 denotes data O due to the late arrival of data A relative to the rising clock edge 304.

After a delay time, the clock signal CLK_RTN may be caused to transition from high to low, thereby generating a falling clock edge 315, a center of which is denoted by point f. For example, point f denotes the arrival of falling clock edge 315 at read FIFO 210.

In some examples, the rising clock edge 302 might be received at delay circuit 245 and clock generator 225 concurrently. Delay circuit 245 may be set to output (e.g., send) signal 247 to clock generator 225 at a certain (e.g., a predetermined) delay time after delay circuit 245 receives rising clock edge 302. Delay circuit 245 might be part of the I/O control circuitry 112 in FIG. 1, for example.

Signal 247, for example, may cause clock generator 225 to cause the clock signal CLK_RTN to transition from high to low, thereby generating falling clock edge 315. That is, for example, falling clock edge 315 might be generated in response to the signal 247 from delay circuit 245. In some examples, the signal 247 might include a clock edge, such as a rising clock edge, and falling clock edge 315 might be generated in response to that clock edge.

The delay time may be independent of the clock signal CLK. That is, for example, the delay time may be independent of when the falling edge 320 of the clock signal CLK that immediately follows the rising clock edge 302 occurs. As such, for example, the time between when the rising clock edge 304 of the clock signal CLK_RTN occurs and when the falling clock edge 315 of the clock signal CLK_RTN occurs may be substantially equal to (e.g., equal to) the delay time caused by delay circuit 245 and may be independent of the time between when the rising clock edge 302 of the clock signal CLK occurs and when the falling clock edge 320 of the clock signal CLK occurs. Therefore, falling clock edge 315 of the clock signal CLK_RTN may be generated asynchronously. Delay circuit 245 may be set to cause the falling clock edge 315 to occur at the delay time after rising clock edge 304, for example.

Data A, for example, may be latched to read FIFO 210 (e.g., to latches 220) in response to the clock signal CLK_RTN transitioning from high to low. That is, data A may be latched to read FIFO 210 in response to falling clock edge 315, e.g., at point f, as denoted by arrow 317.

There may be a variation in when the clock signal CLK_RTN transitions from high to low, and thus when the falling clock edge 315 is generated, e.g., as denoted by falling clock edges 332 and 324. This may be due to uncertainties in the delay circuit 245. Point g at the center of falling clock edge 332 denotes the arrival of clock edge 332 at read FIFO 210, and point h at the center of falling clock edge 324 denotes the arrival of clock edge 324 at read FIFO 210. For example, data at read FIFO 210 might be latched at point g at the center of falling clock edge 332 or at point h at the center of falling clock edge 324.

However, problems may occur when falling edge 332 coincides with the region 312, denoting data O due to the late arrival of data A at read FIFO 210. Point k corresponds to the time that the point g occurs, and thus corresponds the time that the falling clock edge 332 arrives at read FIFO 210. For example, when data A arrives late, point k indicates that the data O in region 312, instead of the desired (e.g., addressed) data A, is at read FIFO 210 when the falling clock edge 332 arrives at read FIFO 210. As result, for example, the data O might be latched to read FIFO 210 instead of the desired (e.g., addressed) data A.

The clock signal CLK may again transition from low to high at the start of a new cycle of the clock signal CLK, thereby generating a rising clock edge 330. The rising clock edge 330 might be received concurrently at clock generator 225 and delay circuit 245, for example. The rising clock edge 330 may cause clock generator 225 to generate a rising clock edge 334 in the clock signal CLK_RTN, as indicated by arrow 336. That is, for example, the clock signal CLK_RTN transitions from low to high to produce rising clock edge 334 in response to the clock signal CLK transitioning from low to high to produce rising clock edge 330.

The rising clock edge 330 may also cause clock generator 225 to output the signal 228 (FIG. 2) that causes data cache 118 (e.g., latches 230) to output the data B, as indicated by arrow 340. That is, for example, data B may be output in response to clock signal CLK transitioning from low to high to produce rising clock edge 330. For example, output (e.g. transfer) of data B from data cache 118 may be initiated in response to rising clock edge 330. Rising clock edge 334 may be generated concurrently with the output of data B, for example. In some examples, generating the rising clock edge 334 in the clock signal CLK_RTN in response to rising clock edge 330 may include outputting the rising clock edge 334 from clock generator 225, and thus data from data cache 118, in response to rising clock edge 330. For example, rising clock edge 334 and data B might be output concurrently from data cache 118.

Point m (e.g., at the center of rising clock edge 334) denotes the arrival of rising clock edge 334 at read FIFO 210, and point n denotes the arrival of data B at read FIFO 210. Ideally, rising clock edge 334 and data B might arrive at read FIFO 210 concurrently (e.g., at the same time). Data B might arrive at read FIFO 210 after data A arrives at read FIFO 210, for example. Note, the roundtrip time difference occurs between the time at the center rising clock edge 330, denoted by point p, and the time at points m and n.

Although steps might be taken to facilitate data B and rising clock edge 334 (e.g., the center of rising clock edge 334) arriving at read FIFO 210 at the same time, e.g., points m and n might occur at the same time, there might be a variation between the time when rising clock edge 334 arrives at read FIFO 210 and the time when data B arrives at read FIFO 210. For example, data B might arrive early relative to (e.g., might arrive before) rising clock edge 334. That is, for example, point q denotes data B arriving before rising clock edge 334, e.g., point q occurs before point m. For example, region 344 denotes data B arriving early relative to the rising clock edge 334.

Problems may occur when falling edge 324 coincides with the region 344. Point x corresponds to the time that the point h occurs, and thus corresponds the time that the falling clock edge 324 arrives at read FIFO 210. For example, when data B arrives early, point x indicates that the data B in region 344, instead of the desired (e.g., addressed) data A, is at read FIFO 210 when the clock edge 324 arrives at read FIFO 210. For example, data B might be latched to read FIFO 210 instead of the desired (e.g., addressed) data A.

Data B might arrive late relative to (e.g., might arrive after) rising clock edge 334. That is, for example, point r denotes data B arriving after rising clock edge 334, e.g., point r occurs after point m. For example, region 346 denotes the data A due to the late arrival of data B relative to the rising clock edge 334.

After a delay time, the clock signal CLK_RTN may be caused to transition from high to low, thereby generating a falling clock edge 350, a center of which is denoted by point s. For example, point s denotes the arrival of falling clock edge 350 at read FIFO 210.

Falling clock edge 350 may be generated asynchronously. For example, at a certain (e.g., a predetermined) delay time after the rising edge 330 of the clock signal CLK is received at delay circuit 245, delay circuit 245 (FIG. 2) might output (e.g., generate) the signal 247 that may cause clock generator 225 to cause the clock signal CLK_RTN transition from high to low, thereby generating falling clock edge 350. In some examples, the signal 247 might include a clock edge, such as a rising clock edge, and falling clock edge 350 might be generated in response to that clock edge.

The delay time may be independent of when the falling edge of the clock signal CLK that immediately follows the rising clock edge 330 occurs. As such, for example, the time between when the rising clock edge 334 of the clock signal CLK_RTN occurs and when the falling clock edge 350 of the clock signal CLK_RTN occurs may be substantially equal to (e.g., equal to) the delay time caused by delay circuit 245 and may be independent of the time between when the rising clock edge 330 of the clock signal CLK occurs and when the falling edge of the clock signal CLK that immediately follows the rising clock edge 330 occurs. Therefore, falling clock edge 350 of the clock signal CLK_RTN may be generated asynchronously. For example, delay circuit 245 may be set to cause the falling clock edge 350 to occur at the delay time after rising clock edge 334.

Data B, for example, may be latched to read FIFO 210, e.g., latches 220, in response to the clock signal CLK_RTN transitioning from high to low. That is, data B may be latched to read FIFO 210 in response to falling clock edge 350, e.g., at point s, as denoted by arrow 352.

Note, for example, that uncertainties in delay circuit 245 may cause a variation in when the clock signal CLK_RTN transitions from high to low, and thus when the falling clock edge 350 is generated, e.g., as denoted by falling clock edges 354 and 358. Point t at the center of falling clock edge 354 denotes the arrival of clock edge 354 at read FIFO 210, and point u at the center of falling clock edge 358 denotes the arrival of clock edge 358 at read FIFO 210. For example, data at read FIFO 210 might be latched at point t at the center of falling clock edge 354 or at point u at the center of falling clock edge 358.

However, problems may occur when falling edge 354 coincides with the region 346, denoting data A due to the late arrival of data B at read FIFO 210. Point v corresponds to the time that the point t occurs, and thus corresponds the time that the falling clock edge 354 arrives at read FIFO 210. For example, when data B arrives late, point v indicates that the data A in region 346, instead of the desired (e.g., addressed) data B, is at read FIFO 210 when the clock edge 354 arrives at read FIFO 210. For example, data A may be latched to read FIFO 210 at falling clock edge 354 instead of the desired (e.g., addressed) data B.

In some examples, the time delay between the arrival of rising clock edge 304 and falling clock edge 315 at read FIFO 210 might be predetermined so that point f of falling clock edge 315 occurs during a particular time period, such as during a particular window of time (e.g., that might be called a data eye) while data A is at read FIFO 210, so that data A is latched to read FIFO 210 during the particular time period (e.g., during the data eye). For example, the time delay might be selected so that the time at which the center of falling clock edge 315 occurs (e.g., the time at which the point f occurs) lies in the data eye, such as the center of the data eye, as shown by arrow 317.

The data eye for particular data, for example, might be defined as the time difference between the latest time at which the particular data arrives at read FIFO 210, relative to the time the rising clock edge of the clock signal CLK-RTN for the particular data arrives at read FIFO 210, and the earliest time at which the data immediately following the particular data arrives at read FIFO 210, relative to the time the rising clock edge of the clock signal CLK-RTN for the data immediately following the particular data arrives at read FIFO 210. For example, the data eye for data A might be defined as the time difference between the latest time at which data A arrives at read FIFO 210 (e.g., the time corresponding to point e), relative to the time rising edge 304 arrives at read FIFO 210 (e.g., relative to the time corresponding to point a of rising edge 304), and the earliest time at which data B arrives at read FIFO 210 (e.g., the time corresponding to point q), relative to the time rising edge 334 arrives at read FIFO 210 (e.g., relative to the time corresponding to point m of rising edge 334), as shown in FIG. 3.

Note that when the variation in the arrival of the falling edge of the clock signal CLK-RTN causes the falling edge of the clock signal CLK-RTN to correspond to times outside of the data eye, failures in latching data to read FIFO 210 may occur, e.g., incorrect data might be read. For example, a data failure region 360 between point k and point e may occur when the data latches in a time range from the time corresponding to points g and k to a time corresponding to the point e. A data failure region 364 between point v and point r may occur when the data latches in a time range from the time corresponding to points t and v to a time corresponding to the point r. A data failure region 370 between point q and point x may occur when the data latches in a time range from a time corresponding to point q to a time corresponding to the points h and x.

As the frequency of the portion of the clock signal CLK that generates the output of data A and data B from data cache 118 and that generates the rising clock edges 304 and 334 of the clock signal CLK-RTN increases, e.g., as the time between point c of rising edge 302 and point p of rising edge 330 (e.g., the period) of the clock signal CLK decreases, and thus the time between the arrival of data A and data B and the time between the arrival of the rising clock edges 304 and 334 at read FIFO 210 decreases, the size of data eye for data A decreases. That is, as the time between the arrival of data A and data B at read FIFO 210 decreases, the point n, denoting the arrival of data B at read FIFO 210, moves closer to the point b, denoting the arrival of data A at read FIFO 210. As a result, for example, the point q, denoting the early arrival of data B at read FIFO 210, moves closer to the point e, denoting the late arrival of data A at read FIFO 210, thus causing the data eye for data A to shrink.

The reduced size of the data eye for data A, for example, may increase the likelihood of latching incorrect data, for example, in that there is a greater likelihood of the falling edge 315 of the clock signal CLK-RTN lying outside the data eye for data A, e.g., due to the variations in the arrival of the falling edge 315 at read FIFO 210 as a result of the uncertainties in the delay circuit 245 that produces the falling edge 315. For example, there is a greater likelihood of the falling edge 332, e.g., point g, lying outside of the data eye for data A when the data eye for data A is smaller.

Figure 4:
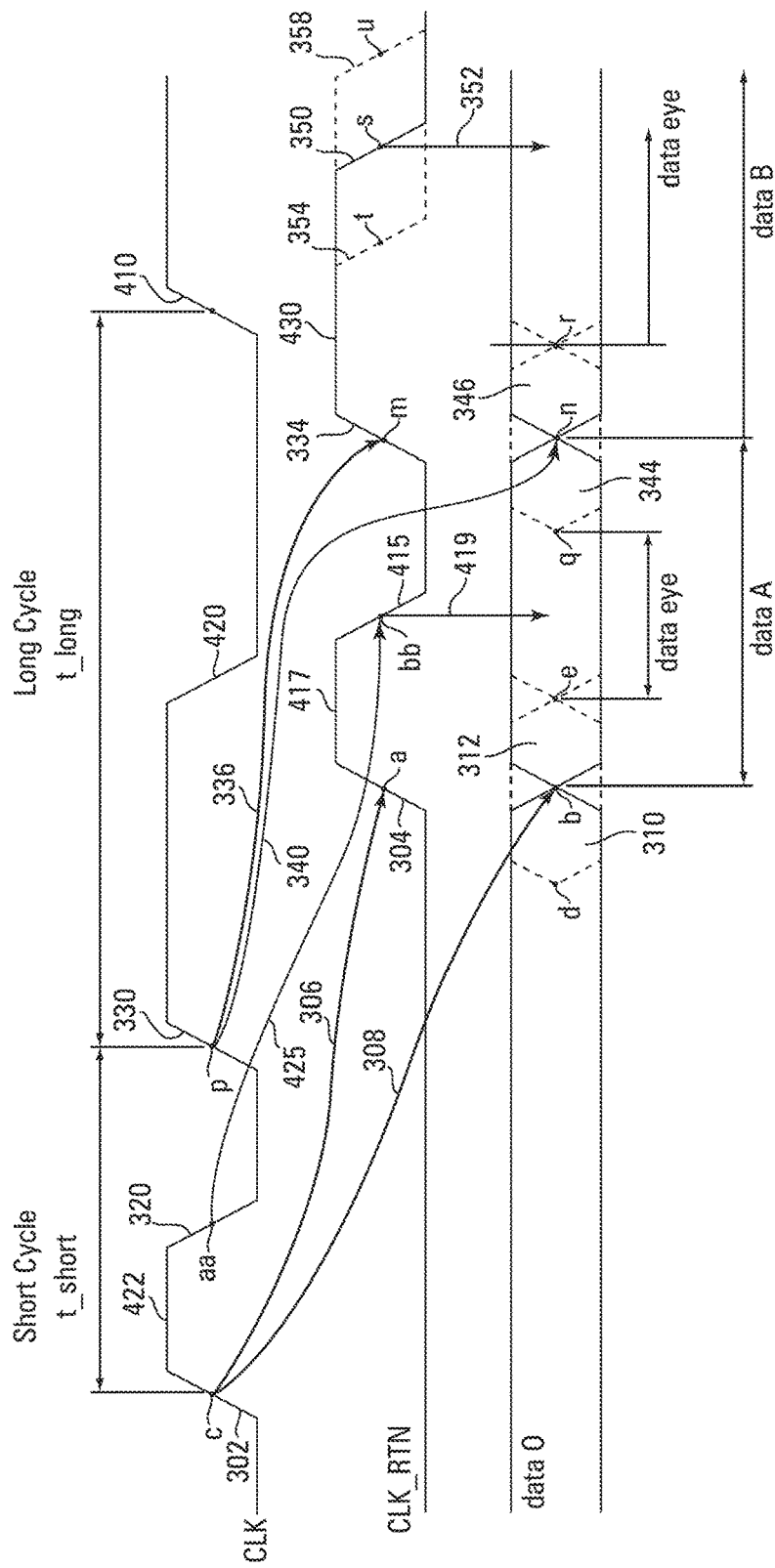
FIG. 4 presents examples of timing diagrams for latching data for output from a memory device.

FIG. 4 illustrates an example of timing diagrams for methods of latching data for output from a memory device, such as memory device 100 of FIG. 1, e.g., as a portion of a read operation. For example, the timing diagrams in FIG. 4 might be for an operation that latches data A and data B to read FIFO 210 for output from memory device 100. Common numbering and common symbols are used in FIGS. 3 and 4 for common (e.g., the same) elements in FIGS. 3 and 4. For example, the elements that are common to FIGS. 3 and 4 may be as described above in conjunction with FIG. 3.

In FIG. 4, the rising edge 304 of clock signal CLK_RTN may be generated in response to rising clock edge 302 of clock signal CLK, as described above in conjunction with FIG. 3, and data A may be output from data cache 118 in response to rising clock edge 302, as described above in conjunction with FIG. 3. For example, rising clock edge 304 may be generated concurrently with the output of data A.

The rising clock edge 302, for example, might correspond to the beginning of a short-clock-cycle (e.g., a higher-frequency) portion of the clock signal CLK having a time period t_short, e.g., that might be as low as ten nanoseconds. For example, clock signal CLK might have one or more short-clock-cycle (e.g., higher-frequency) portions. At a time equal to the time period t_short after the rising clock edge 302, the rising clock edge 330 of the clock signal CLK may occur. Rising clock edge 330, for example, might correspond to the beginning of a long-clock-cycle (e.g., a lower-frequency) portion of the clock signal CLK having a time period t_long, e.g., greater than or equal to 15 nanoseconds. For example, clock signal CLK might have one or more long-clock-cycle (e.g., lower-frequency) portions. The rising clock edge 334 of the clock signal CLK_RTN may be generated in response to rising clock edge 330 of clock signal CLK, as described above in conjunction with FIG. 3, and data B may be output from data cache 118 in response to rising clock edge 330, as described above in conjunction with FIG. 3. For example, rising clock edge 334 may be generated concurrently with the output of data B.

During the long-cycle portion, the clock signal CLK may transition from high to low and may subsequently transition from low to high to produce a rising clock edge 410 of the clock signal CLK at a time equal to the time period time t_long after the rising clock edge 330. Other data may be output from data cache 118 after data B in response to rising clock edge 410, and a rising clock edge of the clock signal CLK_RTN (not shown) might be generated in response to rising clock edge 410. For example, the time between when data A arrives at FIFO 210 and when data B arrives at FIFO 210, such as the time between points b and n, may be less than the time between when data B arrives at FIFO 210 and when the other data arrives at FIFO 210. This may cause the data eye corresponding to data A to be smaller than the data eye corresponding to data B.

The data eye for data A, for example, may be defined as described above in conjunction with FIG. 3. The data eye for data B, for example, might be defined as the time difference between the latest time at which data B arrives at read FIFO 210 (e.g., the time corresponding to point r), relative to the time rising edge 334 arrives at read FIFO 210 (e.g., relative to the time corresponding to point m of rising edge 334), and the earliest time at which the other data output after data B and generated in response to rising edge 410 arrives at read FIFO 210, relative to the time the rising clock edge of the clock signal CLK-RTN for the other data output after data B and generated in response to rising edge 410 arrives at read FIFO 210. For example, data B may be at read FIFO 210 during the data eye for data B.

Since the data eye for data A is relatively small, e.g., due to the short cycle, it may be more likely for data failures to occur when trying to latch data A in response to falling edge 315 of clock signal CLK_RTN when using delay circuit 245 to generate the falling edge 315, as shown in FIG. 3, e.g., due to uncertainties in delay circuit 245. In contrast to using delay circuit 245, clock signal CLK_RTN may be caused to transition from high to low, thereby generating a falling clock edge 415, in response to clock signal CLK transitioning from high to low to generate falling clock edge 320 of clock signal CLK, e.g., where falling clock edge 415 may immediately follow rising clock edge 304 with no intervening falling or rising clock edges of clock signal CLK_RTN. For example, falling clock edge 415 of clock signal CLK_RTN might be generated in response to falling clock edge 320 of clock signal CLK as indicated by arrow 425 in FIG. 4, e.g., where falling clock edge 320 may immediately follow rising edge 302 with no intervening falling or rising clock edges of clock signal CLK. Rising edge 304 of clock signal CLK_RTN and falling edge 415 of clock signal CLK_RTN may define a clock pulse 417 of clock signal CLK_RTN having rising edge 304 and falling edge 415, for example.

Note that in some examples, rising clock edge 302 of clock signal CLK may be received at clock generator 225 and delay circuit 245, e.g., concurrently, and delay circuit might output signal 247 to clock generator 225 at a delay time after receiving rising clock edge 302. Falling clock edge 415 may be generated in response to falling clock edge 320 of clock signal CLK in response to falling clock edge 320 being received at clock generator 225 before signal 247, for example.

Falling clock edge 320 may occur, for example, at midway through the short-cycle portion, e.g., at one half of the time period t_short after rising edge 302 of clock signal CLK occurs. For example, the time between when point aa at the center of falling edge 320 occurs and when point c at the center of rising edge 302 occurs may be one half of the time between when point p at the center of rising edge 330 occurs and when point c occurs (e.g., the time period t_short of the short cycle). For example, rising edge 302 may occur at the beginning of the short-cycle portion; rising edge 330 may occur at the end of the short-cycle portion; and falling edge 320 may occur halfway between rising edge 302 and rising edge 330. Rising edge 302 of clock signal CLK and falling edge 320 of clock signal CLK may define a clock pulse 422 of clock signal CLK having rising edge 302 and falling edge 320, for example.

Data A, for example, may be latched to read FIFO 210 (e.g., to latches 220) in response to falling clock edge 415, e.g., at point bb at the center of falling clock edge 415, as denoted by arrow 419. Since rising edge 304 of clock signal CLK_RTN is generated in response to the rising edge 302 of clock signal CLK and falling edge 415 of clock signal CLK_RTN is generated in response to the falling edge 320 of clock signal CLK, the portion of clock signal CLK_RTN with rising edge 304 and falling edge 415, e.g., the portion of clock signal CLK_RTN corresponding to data A and corresponding to the short-cycle portion clock signal CLK, may be referred to as a synchronous portion of clock signal CLK_RTN, and data A may be synchronous data latched synchronously. For example, pulse 417 of clock signal CLK_RTN might be a synchronous pulse, in that its rising edge 304 may be generated in response to the rising edge 302 of the clock pulse 422 of the clock signal CLK and its falling edge 415 may be generated in response to the falling edge 320 of the clock pulse 422 of the clock signal CLK. Generating the falling edge 415 of clock signal CLK_RTN in response to the falling edge 320 of clock signal CLK may act to mitigate the time variation in the falling edge 315 shown in FIG. 3 that may occur as a result of the uncertainties in time delay circuit 245, and thus may reduce the likelihood of latching incorrect data instead data A during the short cycle. For example, the synchronous portion of clock signal CLK_RTN may be responsive to falling clock edge 320 being received at clock generator 225 before signal 247.

In some examples, a width of pulse 417 of clock signal CLK_RTN might be substantially equal (e.g., equal) to a width of pulse 422 of clock signal CLK. That is, for example, rising edge 304 might be generated at rising edge 302, and falling edge 415 might be generated at falling edge 320, so that the width of pulse 417 and the width of pulse 422 might be substantially equal (e.g., equal) to each other. For example, the timing between the rising edge 302 and generation of rising edge 304 might be the same as a timing between falling edge 320 and generation of falling edge 415 so that the width of pulse 417 and the width of pulse 422 might be substantially equal (e.g., equal) to each other.

In other examples, pulse 417 might be widened relative to pulse 422 by delaying the generation of falling edge 415 in response to falling edge 320. For example, to widen pulse 417, the timing between the rising edge 302 and generation of rising edge 304 might be shorter than a timing between falling edge 320 and generation of falling edge 415.

Alternatively, pulse 417 might be narrowed relative to pulse 422 by delaying the generation of rising edge 304 in response to rising edge 302. For example, to narrow pulse 417, the timing between the rising edge 302 and generation of rising edge 304 might be longer than a timing between falling edge 320 and generation of falling edge 415.

In some examples, the time at which falling edge 415 is generated after rising edge 304, and thus the time at which data A is latched, might be adjusted, so that the falling edge 415 (e.g., point bb at the center of the falling edge 415)

occurs within, e.g., at the center of, the data eye for data A while data A is valid at read FIFO 210, and thus so data A is latched within, e.g., at the center of, the data eye for data A. For example, test runs or simulations may be performed, e.g. at the fabrication stage of memory device 100, such as before memory device 100 is released for production and/or sale, in order to determine the time at which (e.g., to determine when) falling edge 415 should be generated so that data A is latched within, e.g., at the center of, the data eye for data A. The time at which falling edge 415 is generated may then be adjusted at the fabrication stage of memory device 100 in response to determining the time at which (e.g., when) falling edge 415 should be generated so that data A is latched within, e.g., at the center of, the data eye for data A.

Control logic 116 may be configured to cause falling edge 415 to arrive at read FIFO 210 while data A is valid at read FIFO 210. For example, control logic 116 may be configured to adjust (e.g., during user operation, such as customer operation, e.g., after memory device 100 has been sold) when (e.g., the time at which) falling edge 415 occurs after rising edge 304 so that falling edge 415 is at read FIFO 210 while data A is valid at read FIFO 210. That is, for example, control logic 116 may be configured to adjust when (e.g., the time at which) falling edge 415 should be generated relative to falling edge 320 so that the falling edge 415 (e.g., point bb at the center of the falling edge 415) occurs within, e.g., at the center of, the data eye for data A while data A is valid at read FIFO 210, and thus so data A is latched within, e.g., at the center of, the data eye for data A.

For example, control logic 116 might be configured to determine the data eye for data A by determining a range of times for data A when data A should be latched. For example, control logic 116 may determine the range of times to be from the time point e occurs (e.g., the latest time data A arrives at read FIFO 210) to the time point q occurs (e.g., the earliest time data B arrives at read FIFO 210). For example, control logic 116 might receive information from read FIFO 210 as to a time when data A arrives at read FIFO 210. Note that data A is at read FIFO 210 between the time data A arrives at read FIFO 210 and the time data B arrives at read FIFO 210.

Control logic 116 may be configured to adjust the arrival time of falling edge 415 at read FIFO 210 to lie with the determined range of times (e.g., within the data eye for data A). Control logic 116, for example, might be configured to determine the latest time data A arrives at read FIFO 210, e.g., during user operation, such as from a sample of times that data A arrives at read FIFO 210, and to determine the earliest time data B arrives at read FIFO 210, e.g., during user operation, such as from a sample of times that data B arrives at read FIFO 210.

Data B may be latched to read FIFO 210 in response to falling edge 350 of clock signal CLK_RTN, as indicated by arrow 352 and as described above in conjunction with FIG. 3. That is, for example, falling clock edge 350 may be generated asynchronously. For example, after a certain (e.g., a predetermined) delay time after delay circuit 245 receives the rising clock edge 330 of the clock signal CLK, delay circuit 245 might output the signal 247 to clock generator 225 that may cause clock generator 225 to cause the clock signal CLK_RTN transition from high to low, thereby generating falling clock edge 350. Delay circuit 245 may be set to output the signal 247 to clock generator 225, and thus to cause the falling clock edge 350 to occur, at the delay time after rising clock edge 334, for example. That is, for example, falling clock edge 350 may be generated in response to signal 247. Falling clock edge 350 may be generated in response to signal 247 in response to signal 247 being received at clock generator 225 before the falling edge 420 of the clock signal CLK that immediately follows the rising edge 330 of the clock signal CLK.

Note, for example, that the delay time may be independent of the clock signal CLK. That is, for example, the delay time may be independent of and may be different, e.g., less, than the time between the rising clock edge 330 of the clock signal CLK and the immediately following falling clock edge 420 of the clock signal CLK. That is, the falling clock edge 350 of the clock signal CLK_RTN may be generated independently of the falling clock edge 420 that immediately follows, with no intervening clock edges, the rising clock edge 330 that the rising clock edge 334 is generated in response to. As such, for example, falling edge 350 may be said to be generated asynchronously.

Since falling edge 350 of clock signal CLK_RTN is generated asynchronously, the portion of clock signal CLK_RTN corresponding to data B and corresponding to the long-cycle portion of clock signal CLK, may be referred to as an asynchronous portion of clock signal CLK_RTN. Rising edge 334 of clock signal CLK_RTN and falling edge 350 of clock signal CLK_RTN may define a clock pulse 430 of clock signal CLK_RTN having rising edge 334 and falling edge 350, for example.

Clock pulse 430, for example, might be an asynchronous clock pulse, in that its rising edge 334 may be generated in response to the rising edge 330 of clock signal CLK and its falling edge 350 may be generated in response to the signal 247 that occurs at the delay time after the rising edge 330. For example, the width of pulse 430 might be substantially equal to (e.g., equal to) the delay time set in delay circuit 245. Note, for example, that the asynchronous portion of clock signal CLK_RTN may be responsive to signal 247 being received at clock generator 225 before the falling edge 420 of the clock signal CLK.

Clock signal CLK_RTN may include the synchronous portion corresponding to the short cycle of clock signal CLK and data A and the asynchronous portion corresponding to the long cycle of clock signal CLK and data B, and thus may be referred to as a hybrid clock signal CLK_RTN. In some examples, hybrid clock signal CLK_RTN may include one or more synchronous portions respectively corresponding to one or more short-cycle portions of clock signal CLK and one or more asynchronous portions respectively corresponding to one or more long-cycle portions of clock signal CLK.

For the long-cycle portion of clock signal CLK, the data eye for data B may be larger than the time variation in the generation of falling clock edge 350 (FIG. 3) due to uncertainties in delay circuit 245. For example, the data eye for data B may be large enough so that falling edge 354 (FIG. 3) lies within the data eye for data B. That is, for example, for the long-cycle portion of clock signal CLK, the resulting larger data eye for data B may act to reduce the likelihood of latching incorrect data at the falling edge of clock signal CLK_RTN instead of data B even though the falling edge of clock signal CLK_RTN is generated by time delay circuit 245.

In some examples, the control logic 116 in FIG. 1 might monitor the frequency, e.g., the period, of clock signal CLK. For example, when the frequency is greater than a certain frequency (e.g., when the period is less than a certain time period, such as less than 15 nanoseconds), control logic 116 might cause memory device 100 to generate a synchronous portion of clock signal CLK_RTN and data to be latched at the falling clock edge of the synchronous portion of clock signal CLK_RTN, as described above in conjunction with FIG. 4. That is, for example, control logic 116 may cause the memory device 100 in FIG. 1 to operate in a synchronous mode of operation in response to control logic 116 determining that the period of clock signal CLK is less than the certain time period, where the synchronous mode of operation may include the synchronous portion of clock signal CLK_RTN being generated and data being latched at the falling clock edge of the synchronous portion of clock signal CLK_RTN in response to control logic 116 determining that the period of clock signal CLK is less than the certain time period.

In some examples, when the frequency is less than (e.g., or equal to) the certain frequency (e.g., when the period is greater than (e.g., or equal to) the certain time period), control logic 116 might cause memory device 100 to generate an asynchronous portion of clock signal CLK_RTN and data to be latched at the falling clock edge of the asynchronous portion of clock signal CLK_RTN, as described above in conjunction with FIGS. 3 and 4. That is, for example, control logic 116 might cause memory device 100 to operate in an asynchronous mode of operation in response to control logic 116 determining that the period of clock signal CLK is greater than (e.g., or equal to) the certain time period, where the asynchronous mode of operation may include the asynchronous portion of clock signal CLK_RTN being generated and data being latched at the falling clock edge of the asynchronous portion of clock signal CLK_RTN in response to control logic 116 determining that the period of clock signal CLK is greater than (e.g., or equal to) the certain time period.

CONCLUSION

Although specific examples have been illustrated and described herein, it will be appreciated by those of ordinary skill in the art that any arrangement that is calculated to achieve the same purpose may be substituted for the specific examples shown. Many adaptations of the examples will be apparent to those of ordinary skill in the art. Accordingly, this application is intended to cover any adaptations or variations of the examples.

What is claimed is:

1. A memory device, comprising:
a controller; and
a read buffer;
wherein the controller is configured to cause the memory device to generate a first clock edge of a first clock signal in response to a first clock edge of a second clock signal;
wherein the controller is configured to cause the memory device to generate a second, opposite, clock edge of the first clock signal immediately following the first clock edge of the first clock signal in response to a second, opposite, clock edge of the second clock signal immediately following the first clock edge of the second clock signal;
wherein the controller is configured to cause the memory device to latch data for output from the memory device in response to the second clock edge of the first clock signal, wherein the controller being configured to cause the memory device to latch data for output from the memory device in response to the second clock edge of the first clock signal comprises the controller being configured to cause the memory device to latch the data to the read buffer for output from the memory device in response to the second clock edge of the first clock signal; and
wherein the controller is configured to adjust arrival of the second clock edge of the first clock signal at the read buffer so that the second clock edge of the first clock signal arrives at the read buffer while the data is at the read buffer.

2. A memory device, comprising:
a controller;
a read buffer;
a memory array connected to the controller; and
a data cache connected between the memory array and the read buffer;
wherein the controller is configured to cause the memory device to generate a first clock edge of a first clock signal in response to a first clock edge of a second clock signal, wherein the controller being configured to cause the memory device to generate the first clock edge of the first clock signal in response to the first clock edge of the second clock signal comprises the controller being configured to cause the first clock edge of the first clock signal to be output from the data cache and to be sent to the read buffer in response to the first clock edge of the second clock signal;
wherein the controller is configured to cause the memory device to generate a second, opposite, clock edge of the first clock signal immediately following the first clock edge of the first clock signal in response to a second, opposite, clock edge of the second clock signal immediately following the first clock edge of the second clock signal;
wherein the controller is configured to cause the memory device to latch data for output from the memory device in response to the second clock edge of the first clock signal, wherein the controller being configured to cause the memory device to latch data for output from the memory device in response to the second clock edge of the first clock signal comprises the controller being configured to cause the memory device to latch the data to the read buffer for output from the memory device in response to the second clock edge of the first clock signal; and
wherein the controller is configured to cause the data to be output from the data cache and to be sent to the read buffer in response to the first clock edge of the second clock signal.

3. A memory device, comprising:
a controller; and
a clock generator configured to generate a first clock signal, and to receive a second clock signal and a signal that is different than the first and second clock signals;
wherein the controller is configured to cause the memory device to generate a first clock edge of a first clock signal in response to a first clock edge of a second clock signal;
wherein the controller is configured to cause the memory device to generate a second, opposite, clock edge of the first clock signal immediately following the first clock edge of the first clock signal in response to a second, opposite, clock edge of the second clock signal immediately following the first clock edge of the second clock signal;
wherein the controller is configured to cause the memory device to latch data for output from the memory device in response to the second clock edge of the first clock signal;

wherein the clock generator is further configured to generate another clock edge of the first clock signal, opposite the first clock edge of the first clock signal, in response to the signal that is different than the first and second clock signals; and wherein the controller is further configured to cause the memory device to latch other data in response to the other clock edge of the first clock signal for output from the memory device.

4. The memory device of claim 3, wherein the clock generator is configured to generate the other clock edge of the first clock signal in response to the signal that is different than the first and second clock signals in response to a frequency of the second clock signal being less than a certain frequency.

5. A memory device, comprising:

a controller;

wherein the controller is configured to cause the memory device to generate a first clock edge of a first clock signal in response to a first clock edge of a second clock signal;

wherein the controller is configured to cause the memory device to generate a second, opposite, clock edge of the first clock signal immediately following the first clock edge of the first clock signal in response to a second, opposite, clock edge of the second clock signal immediately following the first clock edge of the second clock signal;

wherein the controller is configured to cause the memory device to latch data for output from the memory device in response to the second clock edge of the first clock signal; and wherein the controller is further configured to cause the memory device to latch the data to a buffer of the memory device in response to the second clock edge of the first clock signal.

6. The memory device of claim 3, wherein the controller is further configured to cause the memory device to generate the second clock signal in response to receiving a read enable signal at the memory device.

7. A memory device, comprising:

a controller;

wherein the controller is configured to cause the memory device to generate a first clock edge of a first clock signal in response to a first clock edge of a second clock signal;

wherein the controller is configured to cause the memory device to generate a second, opposite, clock edge of the first clock signal immediately following the first clock edge of the first clock signal in response to a second, opposite, clock edge of the second clock signal immediately following the first clock edge of the second clock signal;

wherein the controller is configured to cause the memory device to latch data for output from the memory device in response to the second clock edge of the first clock signal; and wherein the controller is further configured to cause the memory device to generate the second clock edge of the first clock signal in response to the second clock edge of the second clock signal while a frequency of the second clock signal is greater than a certain frequency.

8. A memory device, comprising:

a controller;

wherein the controller is configured to cause the memory device to generate a first clock edge of a first clock signal in response to a first clock edge of a second clock signal;

wherein the controller is configured to cause the memory device to generate a second, opposite, clock edge of the first clock signal immediately following the first clock edge of the first clock signal in response to a second, opposite, clock edge of the second clock signal immediately following the first clock edge of the second clock signal;

wherein the controller is configured to cause the memory device to latch data for output from the memory device in response to the second clock edge of the first clock signal; and wherein the controller is further configured to cause the memory device to cause the second clock edge of the second clock signal immediately following the first clock edge of the second clock signal to occur at one half of a period of a cycle of the second clock signal, and to cause the first clock edge of the second clock signal to occur at a beginning of the cycle of the second clock signal.

* * * * *